(12) United States Patent
You

(10) Patent No.: US 9,401,218 B2
(45) Date of Patent: Jul. 26, 2016

(54) FUSE CIRCUIT AND SEMICONDUCTOR APPARATUS INCLUDING THE SAME

(71) Applicant: SK hynix Inc., Icheon-si Gyeonggi-do (KR)

(72) Inventor: Jung Taek You, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/573,707

(22) Filed: Dec. 17, 2014

(65) Prior Publication Data

US 2016/0099074 A1    Apr. 7, 2016

(30) Foreign Application Priority Data

Oct. 7, 2014 (KR) .................. 10-2014-0134977

(51) Int. Cl.
*G11C 17/00* (2006.01)
*G11C 17/18* (2006.01)
*G11C 17/16* (2006.01)

(52) U.S. Cl.
CPC ............... *G11C 17/18* (2013.01); *G11C 17/16* (2013.01)

(58) Field of Classification Search
CPC .................................. G11C 17/18; G11C 17/16
See application file for complete search history.

(56) References Cited

U.S. PATENT DOCUMENTS

2004/0151276 A1*  8/2004  Hoffmann .................. 377/65
2005/0076274 A1*  4/2005  Nagai et al. ................ 714/718

FOREIGN PATENT DOCUMENTS

KR    1020080059509 A    6/2008
KR    1020120110771 A    10/2012

* cited by examiner

*Primary Examiner* — Tuan T Nguyen
*Assistant Examiner* — Mohammed A Bashar
(74) *Attorney, Agent, or Firm* — William Park & Associates Ltd.

(57) ABSTRACT

A fuse circuit includes an E-fuse array including a plurality of E-fuse elements configured to store fuse data; a latch block including a plurality of latch groups configured to latch the fuse data read from the E-fuse array; and a control block configured to output latch reset signals corresponding to the plurality of latch groups in response to an apparatus reset signal and a clock signal, wherein the control block sequentially enables the latch reset signals.

20 Claims, 10 Drawing Sheets

FUSE CIRCUIT AND SEMICONDUCTOR APPARATUS INCLUDING THE SAME

CROSS-REFERENCES TO RELATED APPLICATION

The present application claims priority under 35 U.S.C. §119(a) to Korean application number 10-2014-0134977, filed on Oct. 7, 2014, in the Korean Intellectual Property Office, which is incorporated herein by reference in its entirety.

BACKGROUND

1. Technical Field

Various embodiments generally relate to a semiconductor apparatus, and more particularly, to a fuse circuit of a semiconductor apparatus.

2. Related Art

Semiconductor apparatuses, specifically, semiconductor memory apparatuses may be used to store data. Memory apparatuses may be generally divided into a nonvolatile type and a volatile type.

A nonvolatile memory apparatus may retain stored data even though power is not applied. The nonvolatile memory apparatus may include a flash memory apparatus such as a NAND flash and a NOR flash, an FeRAM (ferroelectric random access memory), a PCRAM (phase change random access memory), an MRAM (magnetic random access memory) or an ReRAM (resistive random access memory).

A volatile memory apparatus may not retain and lose stored data when power is not applied. The volatile memory apparatus may include an SRAM (static random access memory) or a DRAM (dynamic random access memory). The volatile memory apparatus may be generally used as a buffer memory apparatus, a cache memory apparatus, a working memory apparatus, or the like, in a data processing system, based on a relatively high processing speed.

SUMMARY

In an embodiment, a fuse circuit may include an E-fuse array including a plurality of E-fuse elements configured to store fuse data. The fuse circuit may also include a latch block including a plurality of latch groups configured to latch the fuse data read from the E-fuse array. In addition, the fuse circuit may include a control block configured to output latch reset signals corresponding to the latch groups in response to an apparatus reset signal and a clock signal, wherein the control block sequentially enables the latch reset signals.

In an embodiment, a fuse circuit may include an E-fuse array including a plurality of E-fuse elements configured to store fuse data. The fuse circuit may also include a latch block configured to latch the fuse data read from the E-fuse array. Further, the fuse circuit may include a control block configured to control a reset of and supply of a voltage to the latch block.

In an embodiment, a semiconductor apparatus may include a memory region configured to store data. The semiconductor apparatus may also include a peripheral circuit configured to control the memory region. The semiconductor apparatus may also include a fuse circuit configured to provide stored fuse data to the peripheral circuit. The fuse circuit may include an E-fuse array including a plurality of E-fuse elements configured to store the fuse data. The fuse circuit may also include a latch block including a plurality of latch groups configured to latch the fuse data read from the E-fuse array. Further, the fuse circuit may include a control block configured to output latch reset signals respectively corresponding to the latch groups in response to an apparatus reset signal and a clock signal, wherein the control block sequentially enables the latch reset signals.

DETAILED DESCRIPTION

Hereinafter, a fuse circuit and a semiconductor apparatus including the same will be described below with reference to the accompanying figures through various embodiments.

Figure 1:
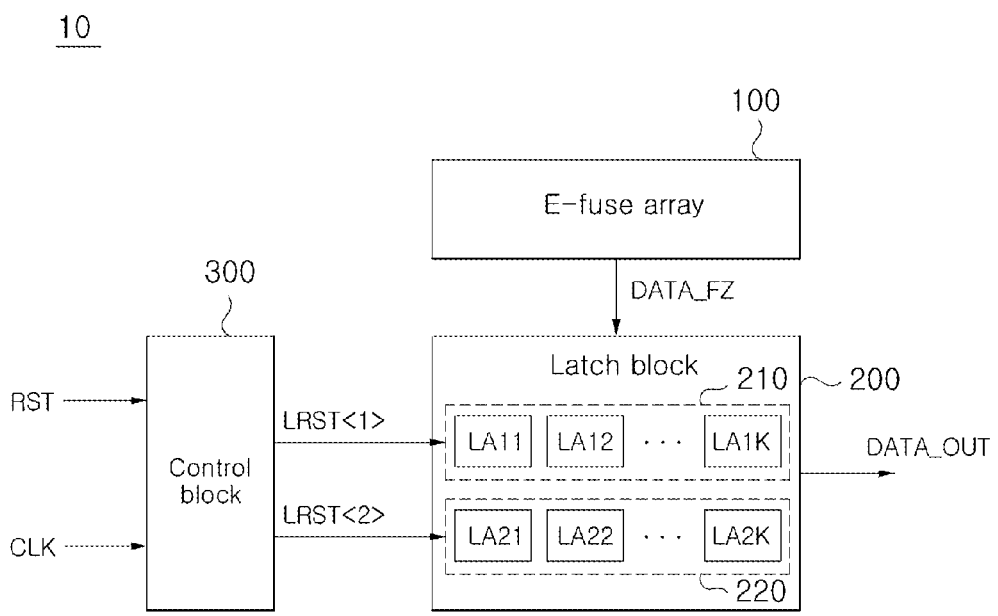
FIG. 1 is a diagram illustrating a representation of an example of a fuse circuit in accordance with an embodiment.

Referring to FIG. 1, a diagram illustrating a representation of an example of a fuse circuit 10 in accordance with an embodiment is shown.

The fuse circuit 10 may include an E-fuse array 100, a latch block 200, and a control block 300.

The E-fuse array 100 may include a plurality of E-fuse elements capable of storing fuse data DATA_FZ. The E-fuse elements may store the fuse data DATA_FZ by being ruptured by a high voltage which has a level enough to rupture the E-fuse elements.

The latch block 200 may include first and second latch groups 210 and 220 configured to latch the fuse data DATA_FZ read from the E-fuse array 100. While it is shown in FIG. 1 that 2 latch groups are included in the latch block 200, it is to be noted that the number of latch groups is not limited specifically.

The first and second latch groups 210 and 220 may receive corresponding latch reset signals LRST<1:2>. Further, the first and second latch groups 210 and 220 may be reset in response to the latch reset signals LRST<1:2>, respectively, to remove residual current before latching the fuse data DATA_FZ. The first and second latch groups 210 and 220 may be sequentially reset in response to the latch reset signals LRST<1:2>, respectively, which are sequentially enabled.

The control block 300 may output first and second latch reset signals LRST<1:2> respectively corresponding to the first and second latch groups 210 and 220, in response to an apparatus reset signal RST and a clock signal CLK. The control block 300 may sequentially enable the first and second latch reset signals LRST<1:2> to sequentially reset the first and second latch groups 210 and 220. For example, the control block 300 may sequentially enable the first and second latch reset signals LRST<1:2> in response to the sequential rising of the clock signal CLK.

The fuse circuit 10 in accordance with an embodiment resets the latch block 200 before setting the fuse data DATA_FZ in the latch block 200. In addition, the latch block 200 is divided into at least 2 latch groups 210 and 220 (LA11 ... LA1K & LA21 ... LA2K) as shown in FIG. 1 such that the latch groups may be sequentially reset. Therefore, since power consumption may be decentralized, a stable operation may be possible. In addition, since the fuse circuit 10 generates the latch reset signals LRST<1:2> by using the clock signal CLK which is provided with a stable frequency, it is possible to effectively control the reset operations of the latch groups.

Figure 2:
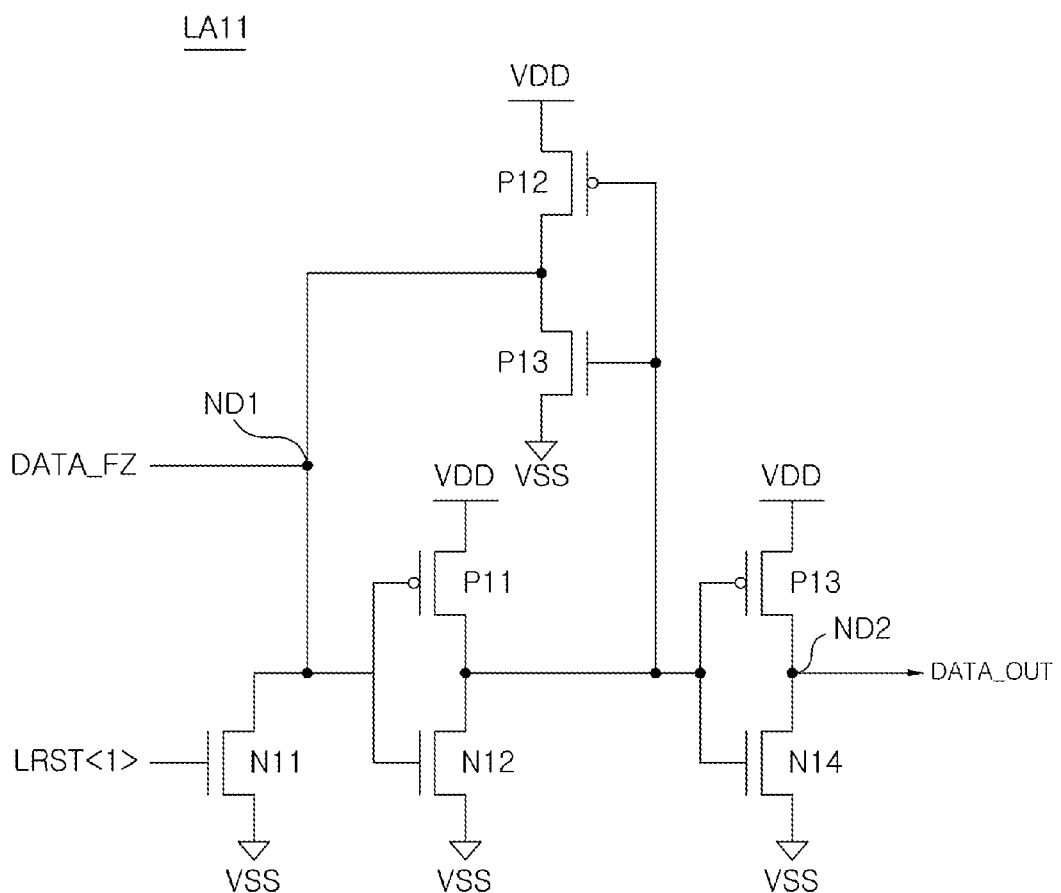
FIG. 2 is a circuit diagram illustrating in detail a representation of an example of the latch shown in FIG. 1.

Referring to FIG. 2, a circuit diagram illustrating in detail a representation of an example of a latch LA11 shown in FIG. 1 is illustrated. Since latches LA11 to LA1k of the first latch group 210 and latches LA21 to LA2k of the second latch group 220 shown in FIG. 1 may be configured in substantially the same way except that the latches LA11 to LA1k of the first latch group 210 receive the first latch reset signal LRST<1> and the latches LA21 to LA2k of the second latch group 220 receive the second latch reset signal LRST<2>, the configuration of the latch LA11 will be described below as an example.

The latch LA11 may be reset in response to the first latch reset signal LRST<1>. The latch LA11 may receive and store the fuse data DATA_FZ through an input node ND1. The latch LA11 may also output stored data through an output node ND2 as output data DATA_OUT.

The latch LA11 may include first to third PMOS transistors P11 to P13, and first to fourth NMOS transistors N11 to N14.

The first NMOS transistor N11 may have the source electrically coupled to a ground voltage terminal VSS, the drain which is electrically coupled to the input node ND1 and the gate which receives the first latch reset signal LRST<1>. The first PMOS transistor P11 may have the source electrically coupled to an external voltage terminal VDD, the drain which is electrically coupled to a latch node ND3 and the gate which is electrically coupled to the input node ND1. The second NMOS transistor N12 may have the source electrically coupled to the ground voltage terminal VSS, the drain electrically coupled to the latch node ND3 and the gate electrically coupled to the input node ND1. The second PMOS transistor P12 may have the source electrically coupled to the external voltage terminal VDD, the drain electrically coupled to the input node ND1 and the gate electrically coupled to the latch node ND3. The third NMOS transistor N13 may have the source electrically coupled to the ground voltage terminal VSS, the drain electrically coupled to the input node ND1 and the gate electrically coupled to the latch node ND3. The third PMOS transistor P13 may have the source electrically coupled to the external voltage terminal VDD, the drain electrically coupled to the output node ND2 and the gate electrically coupled to the latch node ND3. The fourth NMOS transistor N14 may have the source electrically coupled to the ground voltage terminal VSS, the drain electrically coupled to the output node ND2 and the gate electrically coupled to the latch node ND3.

Figure 3:
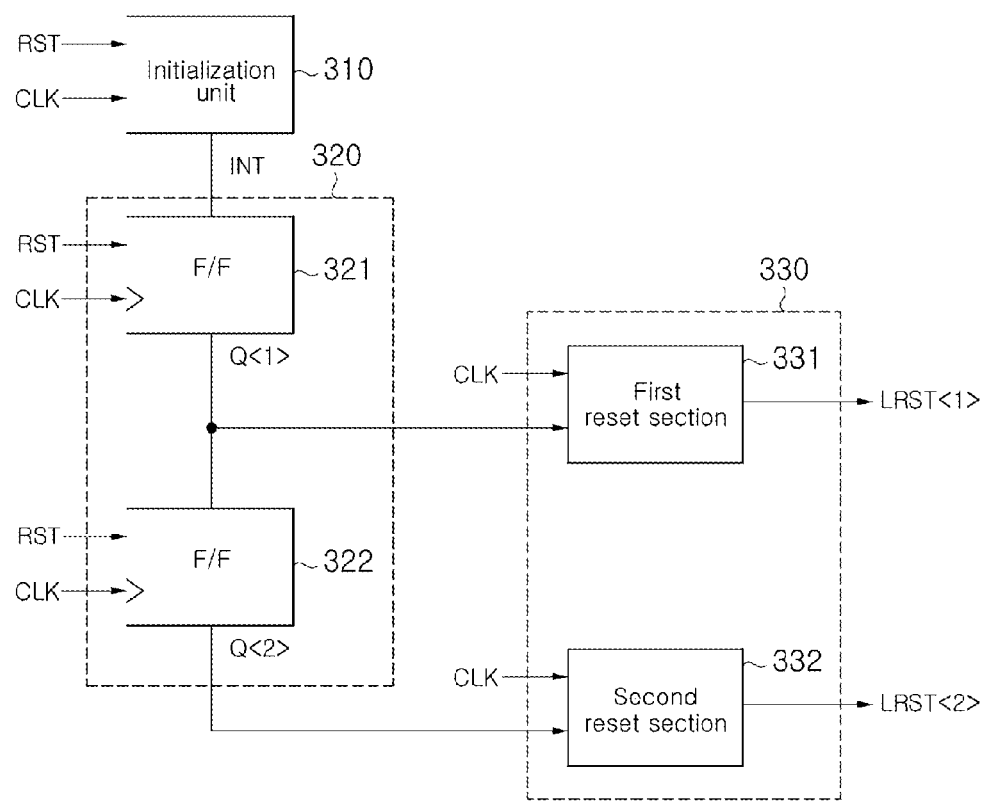
FIG. 3 is a block diagram schematically illustrating a representation of an example of the control block shown in FIG. 1.

Referring to FIG. 3, a block diagram schematically illustrating a representation of an example of the control block 300 shown in FIG. 1 is illustrated.

The control block 300 may include an initialization unit 310, a shift unit 320, and a reset unit 330.

The initialization unit 310 may output an initialization signal INT in response to the apparatus reset signal RST and the clock signal CLK. The initialization unit 310 may enable the initialization signal INT when the apparatus reset signal RST and the clock signal CLK are enabled. The initialization unit 310 may retain the enabled initialization signal INT.

The shift unit 320 may output a plurality of shift signals Q<1:2> generated as the initialization signal INT is sequentially shifted in response to the clock signal CLK. The shift unit 320 may sequentially enable the shift signals Q<1:2> in response to the clock signal CLK when the initialization signal INT is enabled.

The reset unit 330 may output the latch reset signals LRST<1:2> which respectively correspond to the shift signals Q<1:2>, in response to the clock signal CLK. The reset unit 330 may enable corresponding latch reset signals LRST<1:2> in the type of pulses when the shift signals Q<1:2> are respectively enabled. The reset unit 330 may enable the first latch reset signal LRST<1> in the type of pulses when the first shift signal Q<1> is enabled. The reset unit 330 may enable the second latch reset signal LRST<2> in the type of pulses when the second shift signal Q<2> is enabled.

The shift unit 320 may include first and second shift sections 321 and 322.

The first shift section 321 may latch the initialization signal INT in response to the clock signal CLK. The first shift section 321 may also output the latched initialization signal INT as the first shift signal Q<1>. The second shift section 322 may latch the first shift signal Q<1> in response to the clock signal CLK. The second shift section 322 may also output the latched first shift signal Q<1> as the second shift signal Q<2>. The first and second shift sections 321 and 322 may be configured by flip-flops, respectively. The first and second shift sections 321 and 322 may be respectively reset in response to the apparatus reset signal RST.

The reset unit 330 may include first and second reset sections 331 and 332.

The first reset section 331 may enable the first latch reset signal LRST<1> in the type of pulses in response to the clock signal CLK when the first shift signal Q<1> is enabled. The second reset section 332 may enable the second latch reset signal LRST<2> in the type of pulses in response to the clock signal CLK when the second shift signal Q<2> is enabled.

Figure 4:
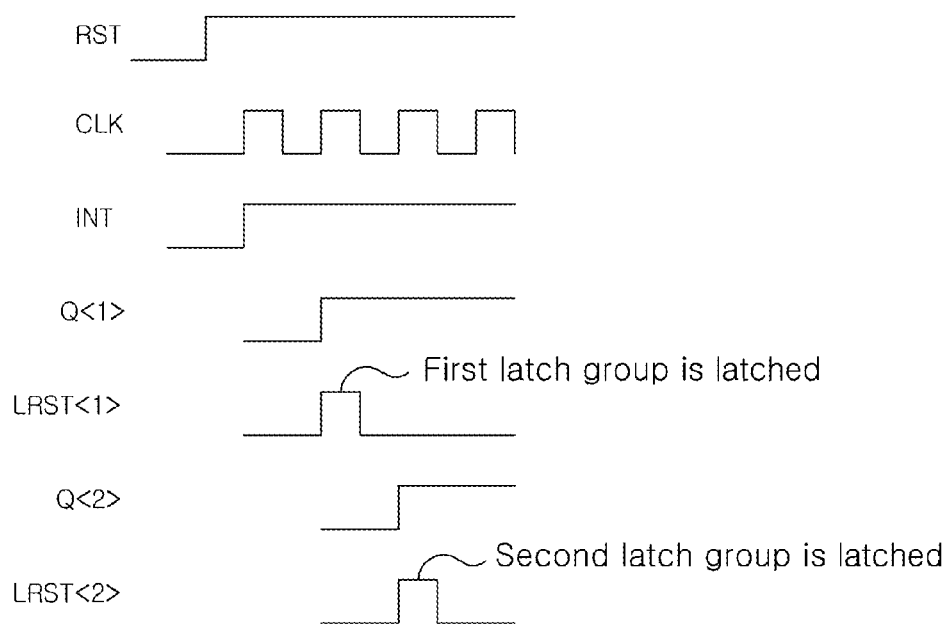
FIG. 4 is a representation of an example of a waveform diagram to assist in the explanation of an operation method of the fuse circuit shown in FIG. 1.

Referring to FIG. 4, a representation of an example of a waveform diagram to assist in the explanation of an operation method of the fuse circuit 10 shown in FIG. 1 is illustrated. Hereafter, the operation method of the fuse circuit 10 will be described in detail with reference to FIGS. 1 to 4.

The control block 300 may receive the apparatus reset signal RST enabled to a logic high.

The initialization unit 310 may output the enabled initialization signal INT in response to the clock signal CLK when the apparatus reset signal RST is enabled. The initialization unit 310 may retain the enabled initialization signal INT.

The first shift section 321 may enable the first shift signal Q<1> by shifting the enabled initialization signal INT in response to the clock signal CLK.

The first reset section 331 may enable the first latch reset signal LRST<1> in the type of pulses in response to the clock signal CLK, when the first shift signal Q<1> is enabled.

The first latch group 210 may be reset in response to the enabled first latch reset signal LRST<1>.

Each of the plurality of latches LA11 to LA1k included in the first latch group 210 may be reset such that a ground voltage VSS is supplied to the input node ND1 in response to the enabled first latch reset signal LRST<1>. Further, an external voltage VDD is supplied to the latch node ND3 as the first PMOS transistor P11 is turned on, and the ground voltage VSS is supplied to the output node ND2 as the fourth NMOS transistor N14 is turned on.

The second shift section 322 may enable the second shift signal Q<2> by shifting the enabled first shift signal Q<1> in response to the clock signal CLK.

The first reset section 332 may enable the second latch reset signal LRST<2> in the type of pulses in response to the clock signal CLK when the second shift signal Q<2> is enabled.

The second latch group 220 may be reset in response to the enabled second latch reset signal LRST<2>.

In summary, the latch block 200 of the fuse circuit 10 may be divided into the latch groups 210 and 220. In addition, the divided latch groups 210 and 220 may be sequentially reset before setting the fuse data DATA_FZ.

Figure 5:
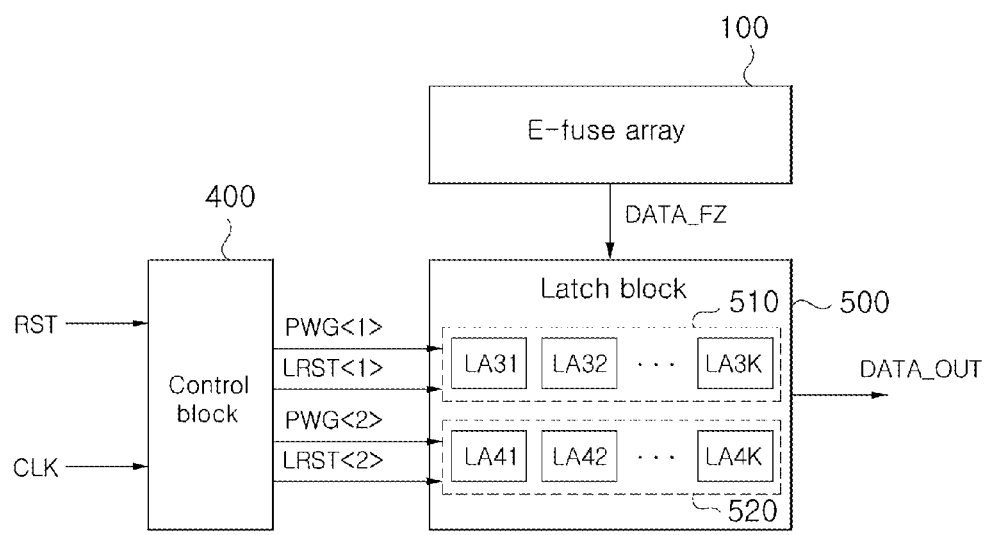
FIG. 5 is a diagram illustrating a representation of an example of a fuse circuit in accordance with an embodiment.

Referring to FIG. 5, a diagram illustrating a representation of an example of a fuse circuit 20 in accordance with an embodiment is illustrated.

The fuse circuit 20 may include an E-fuse array 100, a latch block 500, and a control block 400.

The E-fuse array 100 may include a plurality of E-fuse elements capable of storing fuse data DATA_FZ. The E-fuse elements may store the fuse data DATA_FZ by being ruptured by a high voltage which has a level enough to rupture the E-fuse elements.

The latch block 500 may include first and second latch groups 510 and 520 configured to latch the fuse data DATA_FZ read from the E-fuse array 100. While it is shown in FIG. 5 that 2 latch groups are included in the latch block 500, it is to be noted that the number of latch groups is not limited specifically.

The first and second latch groups 510 (LA31 . . . LA3K) and 520 (LA41 . . . LA4K) may receive corresponding latch reset signals LRST<1:2> and activation signals PWG<1:2>. The first and second latch groups 510 and 520 may also be reset in response to the latch reset signals LRST<1:2> and the activation signals PWG<1:2>, respectively, to remove residual current before latching the fuse data DATA_FZ. The first and second latch groups 510 and 520 may be sequentially reset in response to the latch reset signals LRST<1:2>, respectively, which are sequentially enabled.

The control block 400 may output first and second latch reset signals LRST<1:2> and first and second activation signals PWG<1:2> respectively corresponding to the first and second latch groups 510 and 520 in response to an apparatus reset signal RST and a clock signal CLK.

The control block 400 may sequentially enable the first and second latch reset signals LRST<1:2> to sequentially reset the first and second latch groups 510 and 520. For instance, the control block 400 may sequentially enable the first and second latch reset signals LRST<1:2> in response to the sequential rising of the clock signal CLK.

The control block 400 may control the supply of a ground voltage to the latch block 500 through the first and second activation signals PWG<1:2>. More specifically, the control block 400 may control to cut off the supply of the ground voltage to the latch block 500 before resetting the latch block 500. The control block 400 may control the ground voltage to be supplied to the latch block 500, when resetting the latch block 500. The control block 400 may control the supply of the ground voltage to the latch block 500 to be retained, while the latch block 500 latches the fuse data DATA_FZ. The control block 400 may control the supply of the ground voltage to the respective first and second latch groups 510 and 520, through the first and second activation signals PWG<1:2>, according to the reset timings of the first and second latch groups 510 and 520. The control block 400 may enable the corresponding first and second activation signals PWG<1:2> when sequentially enabling the first and second latch reset signals LRST<1:2>.

The fuse circuit 20 in accordance with an embodiment resets the latch block 500 before setting the fuse data DATA_FZ in the latch block 500. In addition, the latch block 500 is divided into at least 2 latch groups as shown in FIG. 5 such that the latch groups may be sequentially reset. In addition, the fuse circuit 20 may control the supply of the ground voltage to the respective latch groups, to suppress a fighting phenomenon that may occur in internal nodes likely to be in unstable states before resetting the respective latch groups.

Figure 6:
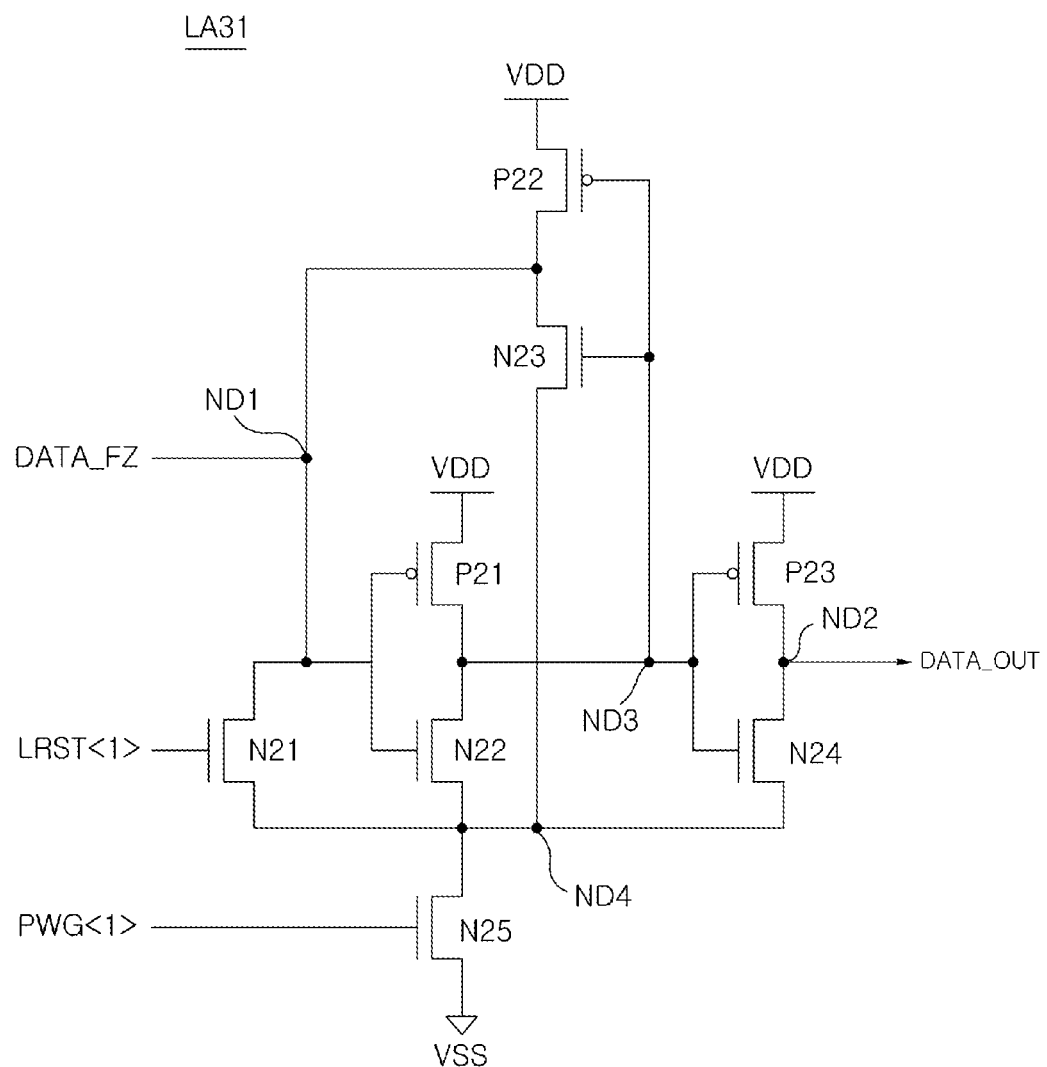
FIG. 6 is a circuit diagram illustrating in detail a representation of an example of the latch shown in FIG. 5.

Referring to FIG. 6, a circuit diagram illustrating in detail a representation of an example of a latch LA31 shown in FIG. 5 is illustrated. Since latches LA31 to LA3k of the first latch group 510 and latches LA41 to LA4k of the second latch group 520 shown in FIG. 5 may be configured in substantially the same way except that the latches LA31 to LA3k of the first latch group 510 receive the first latch reset signal LRST<1> and the latches LA41 to LA4k of the second latch group 520 receive the second latch reset signal LRST<2>, the configuration of the latch LA31 will be described below as an example. In addition, the configuration of the latch LA31 will be described mainly for differences from the configuration of the latch LA11 shown in FIG. 2.

The latch LA31 may be reset in response to the first latch reset signal LRST<1> and the first activation signal PWG<1>. The first activation signal PWG<1> may supply a ground voltage VSS to the latch LA31, and control a current path to be formed in the latch LA31. The latch LA31 may receive and store the fuse data DATA_FZ through an input node ND1. The latch LA31 may also output stored data through an output node ND2 as output data DATA_OUT.

The latch LA31 may include first to third PMOS transistors P21 to P23, and first to fifth NMOS transistors N21 to N25.

The sources of the first, second, third and fourth NMOS transistors N21, N22, N23 and N24 may be electrically coupled to a sink node ND4. The fifth NMOS transistor N25 may have the source electrically coupled to a ground voltage terminal VSS, the drain w electrically coupled to the sink node ND4 and the gate which receives the first activation signal PWG<1>.

Figure 7:
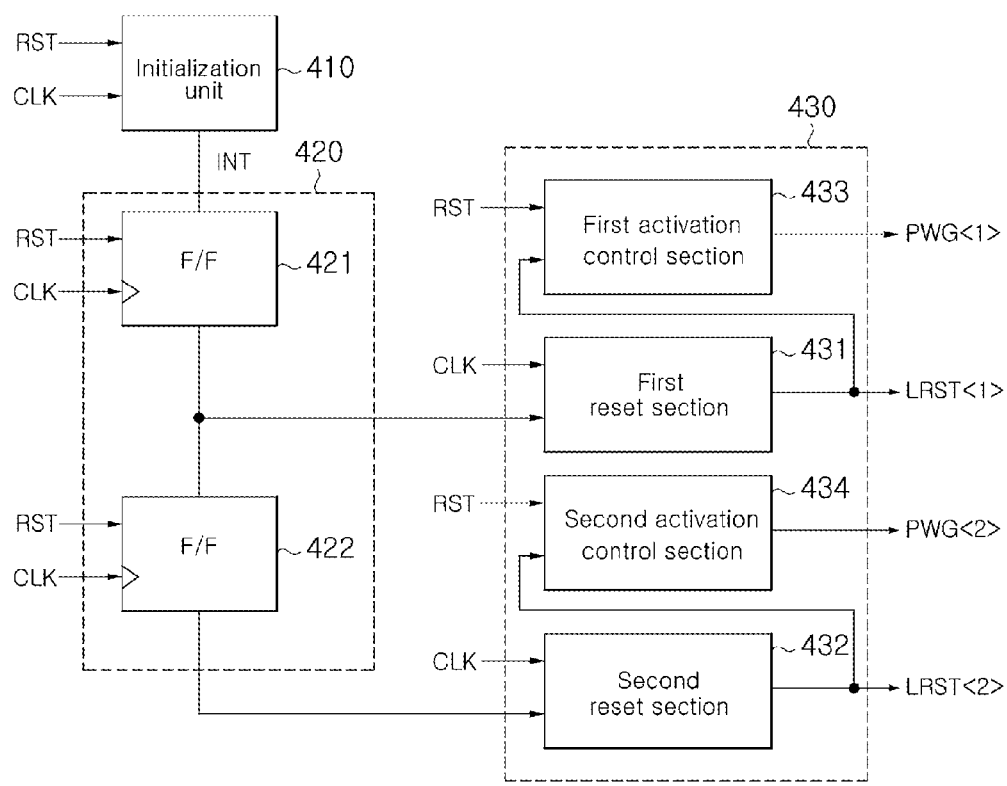
FIG. 7 is a block diagram schematically illustrating a representation of an example of the control block shown in FIG. 5.

Referring to FIG. 7, a block diagram schematically illustrating a representation of an example of the control block 400 shown in FIG. 5 is illustrated.

The control block 400 may include an initialization unit 410, a shift unit 420, and a reset unit 430.

Since the initialization unit 410 and the shift unit 420 may be configured and operate in substantially the same way as the initialization unit 310 and the shift unit 320 of FIG. 1, detailed descriptions will be omitted.

The reset unit 430 may output the latch reset signals LRST<1:2> respectively corresponding to shift signals Q<1:2> in response to the clock signal CLK.

The reset unit 430 may enable corresponding latch reset signals LRST<1:2> in the type of pulses, when the shift signals Q<1:2> are respectively enabled. The reset unit 430 may enable the first latch reset signal LRST<1> in the type of pulses when a first shift signal Q<1> is enabled. The reset unit 430 may enable the second latch reset signal LRST<2> in the type of pulses when a second shift signal Q<2> is enabled.

When the respective latch reset signals LRST<1:2> are enabled, the reset unit 430 may enable the activation signals PWG<1:2> corresponding to the enabled latch reset signals LRST<1:2>. The reset unit 430 may enable the first activation signal PWG<1> when the first latch reset signal LRST<1> is enabled. The reset unit 430 may enable the second activation signal PWG<2> when the second latch reset signal LRST<2> is enabled.

The reset unit 430 may include a first reset section 431, a first activation control section 433, a second reset section 432, and a second activation control section 434.

The first reset section 431 may enable the first latch reset signal LRST<1> in the type of pulses in response to the clock signal CLK when the first shift signal Q<1> is enabled.

The first activation control section 433 may output the first activation signal PWG<1> in response to the first latch reset signal LRST<1> and the apparatus reset signal RST. The first activation control section 433 may disable the first activation signal PWG<1> in response to the apparatus reset signal RST before the first latch reset signal LRST<1> is enabled. The first activation control section 433 may also control the current path of the first latch group 510 not to be formed. The first activation control section 433 may enable the first activation signal PWG<1> when the first latch reset signal LRST<1> is enabled. The first activation control section 433 may retain the enabled first activation signal PWG<1> such that the supply of the ground voltage to the first latch group 510 may be retained.

The second reset section 432 may enable the second latch reset signal LRST<2> in the type of pulses in response to the clock signal CLK when the second shift signal Q<2> is enabled.

The second activation control section 434 may output the second activation signal PWG<2> in response to the second latch reset signal LRST<2> and the apparatus reset signal RST. The second activation control section 434 may disable the second activation signal PWG<2> in response to the apparatus reset signal RST before the second latch reset signal LRST<2> is enabled. The second activation control section 434 may also control the current path of the second latch group 520 not to be formed. The second activation control section 434 may enable the second activation signal PWG<2> when the second latch reset signal LRST<2> is enabled. The second activation control section 434 may retain the enabled second activation signal PWG<2> such that the supply of the ground voltage to the second latch group 520 may be retained.

Figure 8:
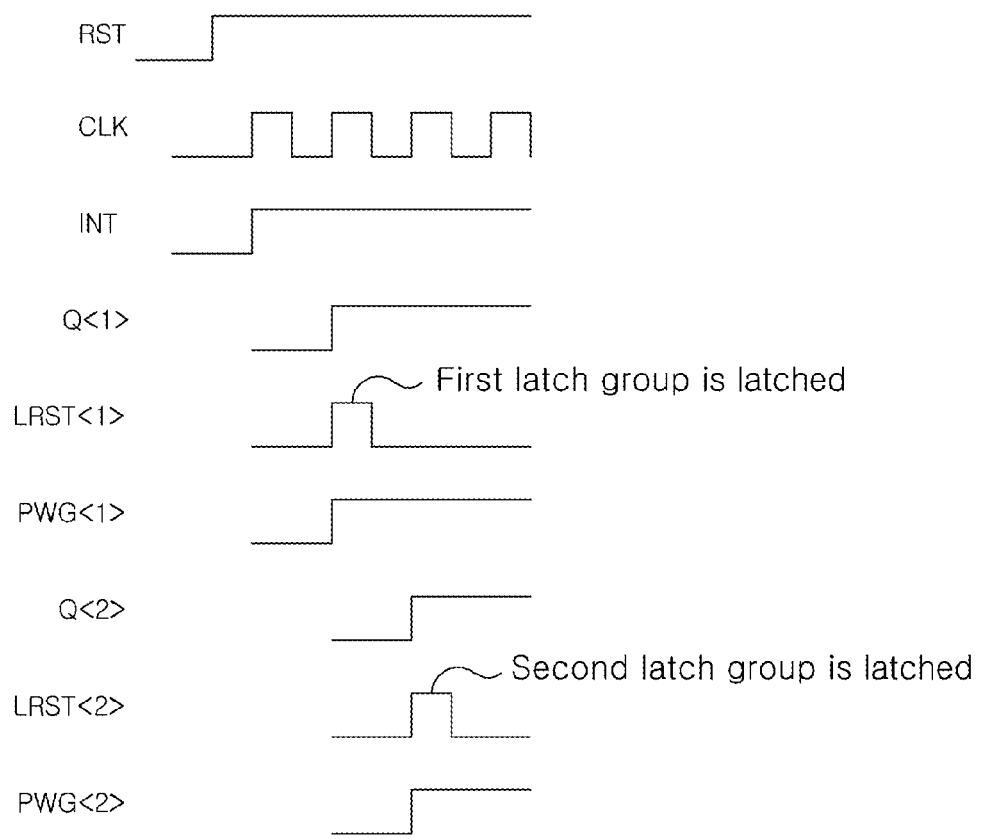
FIG. 8 is a representation of an example of a waveform diagram to assist in the explanation of an operation method of the fuse circuit shown in FIG. 5.

Referring to FIG. 8, a representation of an example of a waveform diagram to assist in the explanation of an operation method of the fuse circuit 20 shown in FIG. 5 is illustrated. Hereafter, the operation method of the fuse circuit 20 will be described in detail with reference to FIGS. 5 to 8.

The control block 400 may receive the apparatus reset signal RST which is enabled to a logic high.

The first and second activation control sections 433 and 434 may disable the first and second activation signals PWG<1:2> before the first and second latch groups 510 and 520 are reset. According to the disabled first and second activation signals PWG<1:2>, a fighting phenomenon likely to occur in the internal nodes of the first and second latch groups 510 and 520 may be suppressed.

The initialization unit 410 may output an enabled initialization signal INT in response to the clock signal CLK when the apparatus reset signal RST is enabled. The initialization unit 410 may retain the enabled initialization signal INT.

A first shift section 421 may enable the first shift signal Q<1> by shifting the enabled initialization signal INT in response to the clock signal CLK.

The first reset section 431 may enable the first latch reset signal LRST<1> in the type of pulses in response to the clock signal CLK when the first shift signal Q<1> is enabled.

The first activation control section 433 may enable the first activation signal PWG<1> when the first latch reset signal LRST<1> is enabled.

The first latch group 510 may be reset in response to the enabled first latch reset signal LRST<1>.

Each of the plurality of latches LA31 to LA3k in the first latch group 510 may be reset such that the ground voltage VSS is supplied to the input node ND1 in response to the enabled first latch reset signal LRST<1> as the ground voltage VSS is supplied to the sink node ND4 in response to the enabled first activation signal PWG<1>. Further, an external voltage VDD is supplied to a latch node ND3 as the first PMOS transistor P11 is turned on, and the ground voltage VSS is supplied to the output node ND2 as the fourth NMOS transistor N14 is turned on.

The first activation control section 433 may retain the enabled first activation signal PWG<1> even after the reset of the first latch group 510 is completed such that the supply of the ground voltage VSS to the first latch group 510 may be retained.

A second shift section 422 may enable the second shift signal Q<2> by shifting the enabled first shift signal Q<1> in response to the clock signal CLK.

The second reset section 432 may enable the second latch reset signal LRST<2> in the type of pulses in response to the clock signal CLK when the second shift signal Q<2> is enabled.

The second activation control section 434 may enable the second activation signal PWG<2> when the second latch reset signal LRST<2> is enabled.

The second latch group 520 may be reset in response to the enabled second latch reset signal LRST<2>.

The second activation control section 434 may retain the enabled second activation signal PWG<2> even after the reset of the second latch group 520 is completed such that the supply of the ground voltage VSS to the second latch group 520 may be retained.

Figure 9:
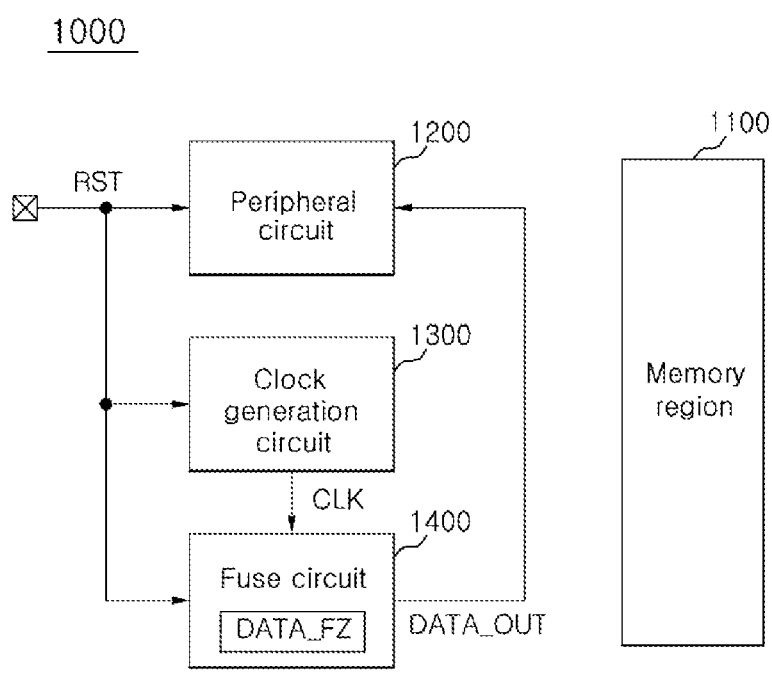
FIG. 9 is a diagram illustrating a representation of an example of a semiconductor apparatus in accordance with an embodiment.

Referring to FIG. 9, a diagram illustrating a representation of an example of a semiconductor apparatus 1000 in accordance with an embodiment is illustrated.

The semiconductor apparatus 1000 may store data under the control of an external device. The semiconductor apparatus 1000 may store data through a write operation, and read stored data through a read operation. The semiconductor apparatus 1000 may be a volatile memory apparatus. However, it is to be noted that the embodiment is not limited to such an example.

The semiconductor apparatus 1000 may include a memory region 1100, a peripheral circuit 1200, a clock generation circuit 1300, and a fuse circuit 1400.

The memory region 1100 may include a plurality of memory cells capable of storing data.

The peripheral circuit 1200 may be configured to control the memory region 1100 through predetermined internal operations. The peripheral circuit 1200 may be configured to control the internal units of the semiconductor apparatus 1000 according to the various control signals inputted from the external device. The peripheral circuit 1200 may perform a reset operation in response to an apparatus reset signal RST inputted from the external device, before performing an internal operation. For example, the peripheral circuit 1200 may perform the reset operation in response to the falling of the apparatus reset signal RST.

The clock generation circuit 1300 may generate a clock signal CLK in response to the apparatus reset signal RST. The clock generation circuit 1300 may generate the clock signal CLK in response to the rising of the apparatus reset signal RST.

The fuse circuit 1400 may be configured and operate in substantially the same way as the fuse circuit 10 shown in FIG. 1 or the fuse circuit 20 shown in FIG. 5. The fuse circuit 1400 may store fuse data DATA_FZ written after the semiconductor apparatus 1000 is packaged. The fuse data DATA_FZ may include various information necessary for the operations of the semiconductor apparatus 1000, for example, information on the failed regions of the memory region 1100. The fuse circuit 1400 may stably perform the latch reset operation described above with reference to FIGS. 1 to 8, in response to the stable clock signal CLK which is transmitted from the clock generation circuit 1300. The fuse circuit 1400 may set the fuse data DATA_FZ in a latch after resetting the latch, and may provide output data DATA_OUT to the peripheral circuit 1200.

Figure 10:
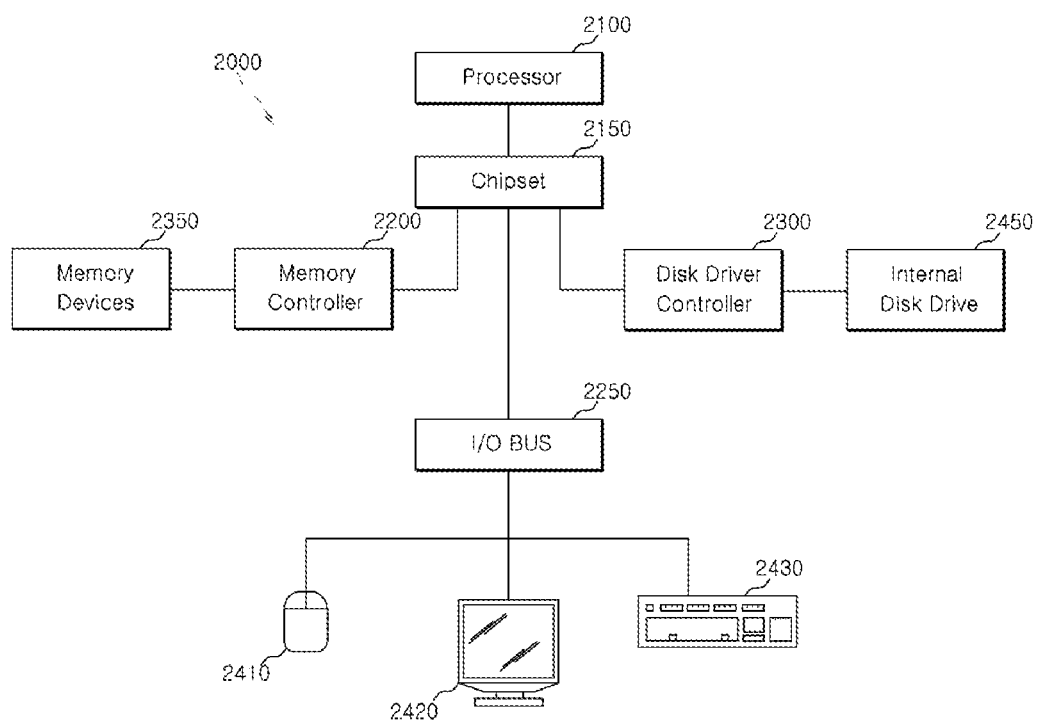
FIG. 10 illustrates a block diagram of a system employing a memory controller circuit in accordance with an embodiment of the invention.

Referring to FIG. 10, a system 2000 may include one or more processors 2100. The processor 2100 may be used individually or in combination with other processors. A chipset 2150 may be electrically coupled to the processor 2100. The chipset 2150 is a communication pathway for signals between the processor 2100 and other components of the system 2000. Other components may include a memory controller 2200, an input/output ("I/O") bus 2250, and a disk drive controller 2300. Depending on the configuration of the system 2000, any one of a number of different signals may be transmitted through the chipset 2150.

The memory controller 2200 may be electrically coupled to the chipset 2150. The memory controller 2200 may be electrically coupled to one or more memory devices 2350. The memory devices 2350 may include the semiconductor apparatus described above.

The chipset 2150 may also be electrically coupled to the I/O bus 2250. The I/O bus 2250 may serve as a communication pathway for signals from the chipset 2150 to I/O devices 2410, 2420 and 2430. The I/O devices 2410, 2420 and 2430 may include a mouse 2410, a video display 2420, or a keyboard 2430. The I/O bus 2250 may employ any one of a number of communications protocols to communicate with the I/O devices 2410, 2420, and 2430.

The disk drive controller 2300 may also be electrically coupled to the chipset 2150. The disk drive controller 2300 may serve as the communication pathway between the chipset 2150 and one or more internal disk drives 2450. The disk drive controller 2300 and the internal disk drives 2450 may communicate with each other or with the chipset 2150 using virtually any type of communication protocol.

As is apparent from the above descriptions, according to the embodiments, the fuse circuit may be stably reset without peak current consumption.

While various embodiments have been described above, it will be understood to those skilled in the art that the embodiments described are by way of example only. Accordingly, the fuse circuit and the semiconductor apparatus including the same described herein should not be limited based on the described embodiments.

What is claimed is:

1. A fuse circuit comprising:
    an E-fuse array including a plurality of E-fuse elements configured to store fuse data;
    a latch block including a plurality of latch groups configured to latch the fuse data read from the E-fuse array; and
    a control block configured to output latch reset signals corresponding to the plurality of latch groups in response to an apparatus reset signal and a clock signal,
    wherein the control block sequentially enables the latch reset signals, and
    wherein the control block sequentially enables a first latch reset signal followed by a second latch reset signal.

2. The fuse circuit according to claim 1, wherein the plurality of latch groups are sequentially reset in response to the latch reset signals.

3. The fuse circuit according to claim 1, wherein the control block sequentially enables the latch reset signals in response to a sequential rising of the clock signal.

4. The fuse circuit according to claim 1, wherein the control block comprises:
    an initialization unit configured to output an initialization signal enabled when the apparatus reset signal and the clock signal are enabled;
    a shift unit configured to output a plurality of shift signals generated as the initialization signal is sequentially shifted in response to the clock signal; and
    a reset unit configured to output the latch reset signals respectively corresponding to the plurality of shift signals in response to the clock signal.

5. The fuse circuit according to claim 4, wherein the reset unit enables corresponding latch reset signals in the type of pulses when the plurality of shift signals are respectively enabled.

6. A fuse circuit comprising:
    an E-fuse array including a plurality of E-fuse elements configured to store fuse data;
    a latch block configured to latch the fuse data read from the E-fuse array; and
    a control block configured to control a reset and supply of a voltage to the latch block,
    wherein the latch block comprises a plurality of latch groups, and
    wherein the control block controls a current path for a first latch group to not be formed until a first latch reset signal is enabled.

7. The fuse circuit according to claim 6, wherein the control block controls the supply of the voltage to the latch block to be cut off before resetting the latch block.

8. The fuse circuit according to claim 6, wherein the control block controls the voltage to be supplied to the latch block when resetting the latch block.

9. The fuse circuit according to claim 6, wherein the control block controls the supply of the voltage to the latch block to be retained while the latch block latches the fuse data.

10. The fuse circuit according to claim 6,
    wherein the control block outputs latch reset signals and activation signals for controlling a current sink of the plurality of latch groups, and
    wherein each of the plurality latch groups receives a corresponding latch reset signal and a corresponding activation signal.

11. The fuse circuit according to claim 10, wherein the control block sequentially enables the latch reset signals in response to a clock signal.

12. The fuse circuit according to claim 10, wherein the control block enables the corresponding activation signal when enabling the corresponding latch reset signal.

13. A semiconductor apparatus comprising:
    a memory region configured to store data;
    a peripheral circuit configured to control the memory region; and a fuse circuit configured to provide stored fuse data to the peripheral circuit, the fuse circuit comprising:

an E-fuse array including a plurality of E-fuse elements configured to store the fuse data;

a latch block including a plurality of latch groups configured to latch the fuse data read from the E-fuse array; and a control block configured to output latch reset signals respectively corresponding to the latch groups in response to an apparatus reset signal and a clock signal, wherein the control block sequentially enables the latch reset signals, and wherein the control block sequentially enables a first latch reset signal followed by a second latch reset signal.

14. The semiconductor apparatus according to claim 13, wherein the plurality of latch groups are sequentially reset in response to the latch reset signals.

15. The semiconductor apparatus according to claim 13, wherein the control block sequentially enables the latch reset signals in response to a sequential rising of the clock signal.

16. The semiconductor apparatus according to claim 13, wherein the control block comprises:

an initialization unit configured to output an initialization signal enabled when the apparatus reset signal and the clock signal are enabled;

a shift unit configured to output a plurality of shift signals generated as the initialization signal is sequentially shifted in response to the clock signal; and a reset unit configured to output the latch reset signals respectively corresponding to the plurality of shift signals in response to the clock signal.

17. The semiconductor apparatus according to claim 16, wherein the reset unit enables corresponding latch reset signals in the type of pulses when the plurality of shift signals are respectively enabled.

18. The semiconductor apparatus according to claim 13, wherein the peripheral circuit performs a reset operation in response to a falling of the apparatus reset signal.

19. The semiconductor apparatus according to claim 13, further comprising:

a clock generation circuit configured to generate the clock signal in response to a rising of the apparatus reset signal.

20. The semiconductor apparatus according to claim 13, wherein the latch block is divided into the plurality of groups to allow the plurality of latch groups to be sequentially reset.

* * * * *